(12) United States Patent
Tsai et al.

(10) Patent No.: US 6,562,725 B2
(45) Date of Patent: May 13, 2003

(54) DUAL DAMASCENE STRUCTURE EMPLOYING NITROGENATED SILICON CARBIDE AND NON-NITROGENATED SILICON CARBIDE ETCH STOP LAYERS

(75) Inventors: Ming-Hsing Tsai, Taipei (TW); Ching-Hua Hsieh, Hsin-chu (TW); Shau-Lin Shue, Hsinchu (TW); Chen-Hua Yu, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 110 days.

(21) Appl. No.: 09/899,420

(22) Filed: Jul. 5, 2001

(65) Prior Publication Data

US 2003/0008511 A1 Jan. 9, 2003

(51) Int. Cl.$^7$ ................................................ H01L 21/00
(52) U.S. Cl. ...................... 438/740; 148/33.2; 216/38; 216/88; 257/752; 438/692
(58) Field of Search .................. 438/635, 637, 438/675, 672, 692, 693, 740; 216/38, 88

(56) References Cited

U.S. PATENT DOCUMENTS

| | | | |
|---|---|---|---|
| 6,100,184 A | 8/2000 | Zhao et al. | |
| 6,140,226 A | 10/2000 | Grill et al. | |
| 6,177,364 B1 | 1/2001 | Huang | |
| 6,221,775 B1 | * 4/2001 | Ference et al. | ......... 438/692 X |

* cited by examiner

Primary Examiner—William A. Powell
(74) Attorney, Agent, or Firm—Tung & Associates

(57) ABSTRACT

Within a dual damascene method for forming a dual damascene aperture within a microelectronic fabrication there is employed a first etch stop layer formed of a first material and a second etch stop layer formed of a second material. One of the first material and the second material is a non-nitrogenated silicon carbide material and the other of the first material and the second material is a nitrogenated silicon carbide material. By employing the first material and the second material, there may be etched completely through the first etch stop layer to reach a contact region formed there beneath while not etching completely through the second etch stop layer to reach a first dielectric layer formed there beneath.

18 Claims, 2 Drawing Sheets

DUAL DAMASCENE STRUCTURE EMPLOYING NITROGENATED SILICON CARBIDE AND NON-NITROGENATED SILICON CARBIDE ETCH STOP LAYERS

BACKGROUND OF THE INVENTION

1. Field of the Invention

The present invention relates generally to methods for forming dual damascene structures within microelectronic fabrications. More particularly, the present invention relates to methods for forming low dielectric constant dual damascene structures within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and microelectronic device and patterned microelectronic conductor layer dimensions have decreased, it has become increasingly common in the art of microelectronic fabrication to employ interposed between the patterns of patterned microelectronic conductor layers when fabricating microelectronic fabrications microelectronic dielectric layers formed of comparatively low dielectric constant dielectric materials. Such comparatively low dielectric constant dielectric materials generally have dielectric constants in a range of from about 1.5 to less than about 4.0. For comparison purposes, microelectronic dielectric layers formed within microelectronic fabrications from conventional silicon oxide dielectric materials, silicon nitride dielectric materials and silicon oxynitride dielectric materials typically have comparatively high dielectric constants in a range of from greater than about 3.5 to about 8.0. Similarly, such patterned microelectronic conductor layers having formed interposed between their patterns microelectronic dielectric layers formed of comparatively low dielectric constant dielectric materials are typically formed within microelectronic fabrications while employing damascene methods, including in particular dual damascene methods.

Microelectronic dielectric layers formed of comparatively low dielectric constant dielectric materials are desirable in the art of microelectronic fabrication formed interposed between the patterns of patterned microelectronic conductor layers within microelectronic fabrications insofar as such microelectronic dielectric layers formed of dielectric materials having comparatively low dielectric constants provide microelectronic fabrications which may theoretically operate at higher microelectronic fabrication speeds, with attenuated patterned microelectronic conductor layer parasitic capacitance and attenuated patterned microelectronic conductor layer cross-talk.

Similarly, damascene methods are desirable in the art of microelectronic fabrication for forming patterned microelectronic conductor layers having formed interposed between their patterns microelectronic dielectric layers formed of comparatively low dielectric constant dielectric materials insofar as damascene methods are comparatively simple fabrication methods which may often be employed to fabricate microelectronic structures which are not otherwise practicably accessible in the art of microelectronic fabrication.

While damascene methods are thus desirable in the art of microelectronic fabrication for forming patterned microelectronic conductor layers having formed interposed between their patterns microelectronic dielectric layers formed of comparatively low dielectric constant dielectric materials within microelectronic fabrications, damascene methods are nonetheless not entirely without problems in the art of microelectronic fabrication for forming patterned microelectronic conductor layers having formed interposed between their patterns microelectronic dielectric layers formed of comparatively low dielectric constant dielectric materials within microelectronic fabrications. In that regard, while damascene methods are generally successful for forming patterned microelectronic conductor layers having formed interposed between their patterns microelectronic dielectric layers formed of comparatively low dielectric constant dielectric materials within microelectronic fabrications, such damascene methods often damage the microelectronic dielectric layers formed of the comparatively low dielectric constant dielectric materials.

It is thus desirable in the art of microelectronic fabrication to provide damascene methods which may be employed in the art of microelectronic fabrication for providing patterned microelectronic conductor layers having formed interposed between their patterns microelectronic dielectric layers formed of comparatively low dielectric constant dielectric materials, with attenuated damage to the microelectronic dielectric layers formed of the comparatively low dielectric constant dielectric materials.

It is towards the foregoing object that the present invention is directed.

Various damascene methods have been disclosed in the art of microelectronic fabrication for forming within microelectronic fabrications damascene structures with desirable properties in the art of microelectronic fabrication.

Included among the damascene methods, but not limited among the damascene methods, are damascene methods disclosed within: (1) Zhao et al., in U.S. Pat. No. 6,100,184 (a dual damascene method for forming a copper containing contiguous patterned conductor interconnect and patterned conductor stud layer within a corresponding trench contiguous with a corresponding via formed through a dielectric layer formed of a comparatively low dielectric constant dielectric material to contact a copper containing conductor layer formed thereunder while employing a conductor barrier/etch stop layer formed selectively passivating only the top surface of the copper containing conductor layer formed thereunder); (2) Grill et al., in U.S. Pat. No. 6,140,226 (a dual damascene method for forming a contiguous patterned conductor interconnect and patterned conductor stud layer within a corresponding trench contiguous with a corresponding via through a dielectric layer formed of a comparatively low dielectric constant dielectric material while employing a sidewall liner layer for purposes of protecting from lateral etching a sidewall of the trench when forming contiguous therewith the via while employing the dual damascene method); and (3) Huang, in U.S. Pat. No. 6,177,364 (a dual damascene method for forming a contiguous patterned conductor interconnect and patterned conductor stud layer within a corresponding trench contiguous with a corresponding via through a dielectric layer formed of a comparatively low dielectric constant fluorosilicate glass (FSG) dielectric material while employing a hydrogen-nitrogen plasma treatment for purposes of passivating a sidewall surface of the dielectric layer within the corresponding trench contiguous with the corresponding via prior to forming therein the contiguous patterned conductor interconnect and patterned conductor stud layer).

Desirable in the art of microelectronic fabrication are additional damascene methods and materials which may be employed in the art of microelectronic fabrication for providing patterned microelectronic conductor layers having formed interposed between their patterns microelectronic dielectric layers formed of comparatively low dielectric constant dielectric materials, with attenuated damage to the microelectronic dielectric layers.

It is towards the foregoing object that the present invention is directed.

SUMMARY OF THE INVENTION

A first object of the present invention is to provide a damascene method for forming within a microelectronic fabrication a patterned microelectronic conductor layer having formed interposed between its patterns a microelectronic dielectric layer formed of a comparatively low dielectric constant dielectric material.

A second object of the present invention is to provide a damascene method in accord with the first object of the present invention, wherein the patterned microelectronic conductor layer is formed with attenuated damage to the microelectronic dielectric layer.

A third object of the present invention is to provide a damascene method in accord with the first object of the present invention and the second object of the present invention, wherein the damascene method is readily commercially implemented.

In accord with the objects of the present invention, there is provided by the present invention a method for forming a dual damascene aperture within a composite dielectric layer. To practice the method of the present invention, there is first provided a substrate having formed therein a contact region. There is then formed upon the substrate and the contact region a blanket first etch stop layer. There is then formed upon the blanket first etch stop layer a patterned first dielectric layer having formed aligned thereupon a patterned second etch stop layer in turn having formed thereupon a patterned second dielectric layer which leaves exposed a top surface portion of the patterned second etch stop layer. Within the present invention, the foregoing series of patterned layers define an aperture aligned above the contact region and having as bottom surfaces exposed top surface portions of the patterned second etch stop layer and the blanket first etch stop layer. Finally, there is then etched completely through the blanket first etch stop layer to reach the contact region while not etching completely through the patterned second etch stop layer to reach the patterned first dielectric layer, to thus form from the aperture a dual damascene aperture. Similarly, within the present invention, one of the blanket first etch stop layer and the patterned second etch stop layer is formed of a non-nitrogenated silicon carbide material and the other of the blanket first etch stop layer and the patterned second etch stop layer is formed of a nitrogenated silicon carbide material.

Within the present invention, a contiguous patterned conductor interconnect and patterned conductor stud layer may be formed into the dual damascene aperture, which comprises a corresponding trench contiguous with a corresponding via which in turn reaches the contact region, while employing a blanket conductor layer deposition and planarizing method, preferably a blanket conductor layer deposition and chemical mechanical polish (CMP) planarizing method.

There is provided by the present invention a damascene method for forming within a microelectronic fabrication a patterned microelectronic conductor layer having formed interposed between its patterns a microelectronic dielectric layer formed of a comparatively low dielectric constant dielectric material, wherein the patterned microelectronic conductor layer is formed with attenuated damage to the microelectronic dielectric layer.

The present invention realizes the foregoing object by employing within a dual damascene method, and for forming a dual damascene aperture within which may be formed a contiguous patterned conductor interconnect and patterned conductor stud layer having formed interposed between its patterns a dielectric layer formed of a low dielectric constant dielectric material, a first etch stop layer formed of a first material and a second etch stop layer formed of a second material, such that when etching completely through the first etch stop layer to reach a contact region formed thereunder when forming the dual damascene aperture, there is not completely etched through the second etch stop layer to reach a first dielectric layer formed thereunder when forming the dual damascene aperture. Similarly, the present invention employs for one of the first material and the second material a non-nitrogenated silicon carbide material and for the other of the first material and the second material a nitrogenated silicon carbide material such as to provide a generally reduced dielectric constant for each of the first material and the second material.

The damascene method in accord with the present invention is readily commercially implemented.

As will be illustrated in greater detail within the context of the Description of the Preferred Embodiment, as set forth below, the damascene method of the present invention employs methods and materials as are otherwise generally known in the art of microelectronic fabrication, but employed within the context of specific process limitations and specific materials limitations to provide the damascene method of the present invention. Since it is thus at least in part a series of specific process limitations and specific materials limitations which provides at least in part the present invention, rather than the existence of methods and materials which provides the present invention, the damascene method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

There is provided by the present invention a damascene method for forming within a microelectronic fabrication a patterned microelectronic conductor layer having formed interposed between its patterns a microelectronic dielectric layer formed of a comparatively low dielectric constant dielectric material, wherein the patterned microelectronic conductor layer is formed with attenuated damage to the microelectronic dielectric layer.

The present invention realizes the foregoing object by employing within a dual damascene method, and for forming a dual damascene aperture within which may be formed a contiguous patterned conductor interconnect and patterned conductor stud layer having formed interposed between its patterns a dielectric layer formed of a low dielectric constant dielectric material, a first etch stop layer formed of a first material and a second etch stop layer formed of a second material, such that when etching completely through the first etch stop layer to reach a contact region formed thereunder when forming the dual damascene aperture, there is not completely etched through the second etch stop layer to reach a first dielectric layer formed thereunder when forming the dual damascene aperture. Similarly, the present invention employs for one of the first material and the second material a non-nitrogenated silicon carbide material and for the other of the first material and the second material a nitrogenated silicon carbide material such as to provide a generally reduced dielectric constant for each of the first material and the second material.

Although the preferred embodiment of the present invention provides particular value within the context of forming, while employing a dual damascene method, and within a semiconductor integrated circuit microelectronic fabrication, a patterned microelectronic conductor layer having formed interposed between its patterns a microelectronic dielectric layer formed of a comparatively low dielectric constant dielectric material, the present invention may nonetheless be employed for forming patterned conductor layers within microelectronic fabrications selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Referring now to FIG. 1 to FIG. 6, there is shown a series of schematic cross-sectional diagrams illustrating the results of progressive stages in forming, in accord with a preferred embodiment of the present invention, a patterned microelectronic conductor layer within a microelectronic fabrication while employing a dual damascene method.

Figure 1:
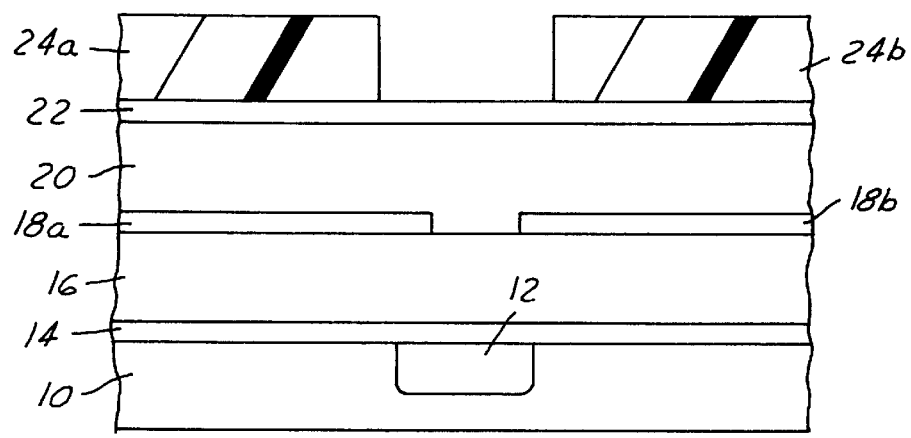
FIG. 1, FIG. 2, FIG. 3, FIG. 4, FIG. 5 and FIG. 6 show a series of schematic cross-sectional diagrams illustrating the results of progressive stages of forming, in accord with a preferred embodiment of the present invention, a patterned conductor layer within a microelectronic fabrication while employing a damascene method.

Shown in FIG. 1 is a schematic cross-sectional diagram of the microelectronic fabrication at an early stage in its fabrication in accord with the preferred embodiment of the present invention.

Shown in FIG. 1, in a first instance, is a substrate 10 having formed therein a contact region 12.

Within the preferred embodiments of the present invention with respect to the substrate 10, the substrate 10 may be a substrate employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may consist of a substrate alone as employed within the microelectronic fabrication, or in an alternative, the substrate 10 may comprise a substrate as employed within the microelectronic fabrication, wherein the substrate has formed thereupon and/or thereover any of several additional microelectronic layers as are conventionally employed within the microelectronic fabrication within which is employed the substrate. Similarly with the substrate alone as employed within the microelectronic fabrication, such additional microelectronic layers may be formed from microelectronic materials selected from the group including but not limited to microelectronic conductor materials, microelectronic semiconductor materials and microelectronic dielectric materials.

In addition, and although also not specifically illustrated within the schematic cross-sectional diagram of FIG. 1, the substrate 10, typically and preferably, but not exclusively, when the substrate 10 consists of or comprises a semiconductor substrate as employed within a semiconductor integrated circuit microelectronic fabrication, has formed therein and/or thereupon microelectronic devices as are similarly also conventional within the microelectronic fabrication within which is employed the substrate 10. Such microelectronic devices may be selected from the group including but not limited to resistors, transistors, diodes and capacitors.

Within the preferred embodiment of the present invention with respect to the contact region 12, the contact region 12 is typically and preferably either: (1) a semiconductor contact region, particularly under circumstances where the substrate 10 consists of or comprises a semiconductor substrate as employed within a semiconductor integrated circuit microelectronic fabrication; or (2) a conductor contact region, under circumstances where the substrate 10 is employed within any of the several microelectronic fabrications as noted above.

Shown also within the schematic cross-sectional diagram of FIG. 1, and formed upon the substrate 10 having formed therein the contact region 12, is a series of layers comprising: (1) a blanket first etch stop/liner layer 14 formed upon the substrate 10 having formed therein the contact region 12; (2) a blanket first dielectric layer 16 formed upon the blanket first etch stop/liner layer 14; (3) a pair of patterned second etch stop layers 18a and 18b formed upon the blanket first dielectric layer 16; (4) a blanket second dielectric layer 20 formed upon exposed portions of the blanket first dielectric layer 16 and the patterned second etch stop layers 18a and 18b; (5) a blanket third etch stop/planarizing stop layer 22 formed upon the blanket second dielectric layer 20; and (6) a pair of patterned photoresist layers 24a and 24b formed upon the blanket third etch stop/planarizing stop layer 22.

Within the preferred embodiment of the present invention with respect to the blanket first etch stop/liner layer 14, the pair of patterned second etch stop layers 18a and 18b and the blanket third etch stop/planarizing stop layer 22, the blanket first etch stop/liner layer 14 is formed of a first etch stop material while at least the pair of patterned second etch stop layers 18a and 18b (and preferably both the pair of patterned second etch stop layers 18a and 18b and the blanket third etch stop/planarizing stop layer 22) is formed of a second etch stop material. Within the present invention, one of the first etch stop material and the second etch stop material is a non-nitrogenated silicon carbide material (i.e., SiC) and the other of the first etch stop material and the second etch stop material is a nitrogenated silicon carbide material (i.e., SiCN). Similarly, within the present invention and the preferred embodiment of the present invention, neither of the first material nor the second material consists of purely a silicon oxide material or a silicon nitride material. More typically and preferably, the blanket first etch stop/liner layer 14 is formed of the nitrogenated silicon carbide material, while at least the pair of patterned second etch stop layers 18a and 18b (and preferably both the pair of patterned second etch stop layers 18a and 18b and the blanket third etch stop/planarizing stop layer 22) is formed of the non-nitrogenated silicon carbide material.

Typically and preferably, the blanket first etch stop/liner layer 14 is formed to a thickness of from about 100 to about 1000 angstroms, the pair of patterned second etch stop layers 18a and 18b is formed to a thickness of from about 100 to about 1000 angstroms and the blanket third etch stop/planarizing stop layer 22 is formed to a thickness of from about 100 to about 1000 angstroms.

Similarly, within the present invention and the preferred embodiment of the present invention, and although any of several methods may be employed for forming the blanket first etch stop/liner layer 14, the pair of patterned second etch stop layers 18a and 18b and the blanket third etch stop/planarizing stop layer 22, including but not limited to chemical vapor deposition (CVD) methods, plasma enhanced chemical vapor deposition (PECVD) methods and physical vapor deposition (PVD) sputtering methods, each of the foregoing series of etch stop layers is preferably formed employing a plasma enhanced chemical vapor deposition (PECVD) method, in general while employing an overlapping selection of source materials (i.e., a methyl silane, dimethylsilane, trimethylsilane and tetramethylsilane silicon source material for forming the non- nitrogenated silicon carbide material and a methyl silane, dimethylsilane, trimethylsilane and tetramethylsilane silicon source material, and an ammonia or nitrogen source material for forming the nitrogenated silicon carbide material). Typically and preferably, the plasma enhanced chemical vapor deposition (PECVD) method also employs with respect to an eight inch or twelve inch diameter substrate: (1) a reactor chamber pressure of from about 1M to about 10 torr; (2) a radio frequency source power of from about 500 to about 2000 watts at a source radio frequency of 13.56 MHZ, without a bias power; (3) a substrate 10 temperature of from about 300 to about 450 degrees centigrade; (4) a methyl silane, dimethylsilane, trimethylsilane and tetramethylsilane silicon source material flow rate of from about 50 to about 500 standard cubic centimeters per minute (sccm); (5) an optional ammonia or nitrogen source material flow rate of from about 50 to about 5000 standard cubic centimeters per minute (sccm).

As is understood by a person skilled in the art, and in accord with additional disclosure which follows, the present invention and the preferred embodiment of the present invention provide particular value insofar as there needs be only comparatively minimal incorporation of nitrogen within a nitrogenated silicon carbide material (i.e., less than about 70 atom percent and more preferably from about 10 to about 60 atom percent) in comparison with a non-nitrogenated silicon carbide material, in order to provide an operable method for forming a dual damascene structure in accord with the present invention and the preferred embodiment of the present invention. As is further understood by a person skilled in the art, such comparatively minimal incorporation of nitrogen into a nitrogenated silicon carbide material in accord with the present invention provides for a dielectric constant of the nitrogenated silicon carbide material of from about 3.8 to about 5.6, while the non- nitrogenated silicon carbide material has a dielectric constant of from about 3.6 to about 5.4.

Within the preferred embodiment of the present invention with respect to the blanket first dielectric layer 16 and the blanket second dielectric layer 20, and while the blanket first dielectric layer 16 and the blanket second dielectric layer 22 may be formed from any of several comparatively low dielectric constant dielectric materials as are conventional or unconventional in the art of microelectronic fabrication, including but not limited to spin-on-glass (SOG) dielectric materials, spin-on-polymer (SOP) dielectric materials, nanoporous dielectric materials, amorphous carbon dielectric materials and fluorosilicate glass (FSG) dielectric materials, the present invention provides particular value under circumstances where the blanket first dielectric layer 16 and the blanket second dielectric layer 20 are formed of a porous dielectric material, and in particular a nanoporous dielectric material, generally having a particularly low dielectric constant in a range of from about 1.5 to about 4. Typically and preferably, each of the blanket first dielectric layer 16 and the blanket second dielectric layer 20 is formed to a thickness of from about 1.5 to about 20 angstroms and each of the blanket first dielectric layer 16 and the blanket second dielectric layer 20 is formed of the same dielectric material, although such limitation is not required within the present invention and the preferred embodiment of the present invention.

Finally, within the preferred embodiment of the present invention with respect to the pair of patterned photoresist layers 24a and 24b, the pair of patterned photoresist layers 24a and 24b may be formed from any of several photoresist materials as are conventional in the art of microelectronic fabrication, including but not limited to photoresist materials selected from the general groups of photoresist materials including but not limited to positive photoresist materials and negative photoresist materials. Typically and preferably, each of the pair of patterned photoresist layers 24a and 24b is formed to a thickness of from about 2000 to about 20000 angstroms.

As is understood by a person skilled in the art, the pair of patterned photoresist layers 24a and 24b defines the location of an really enclosed trench, of linewidth from about 0.08 to about 100 microns, to be formed at least in part through the blanket second dielectric layer 20, while the pair of patterned second etch stop layers 18a and 18b defines the location of an really enclosed via, of linewidth from about 0.08 to about 100 microns, to be formed at least in part through the blanket first dielectric layer 16 and overlapped by the trench.

Figure 2:
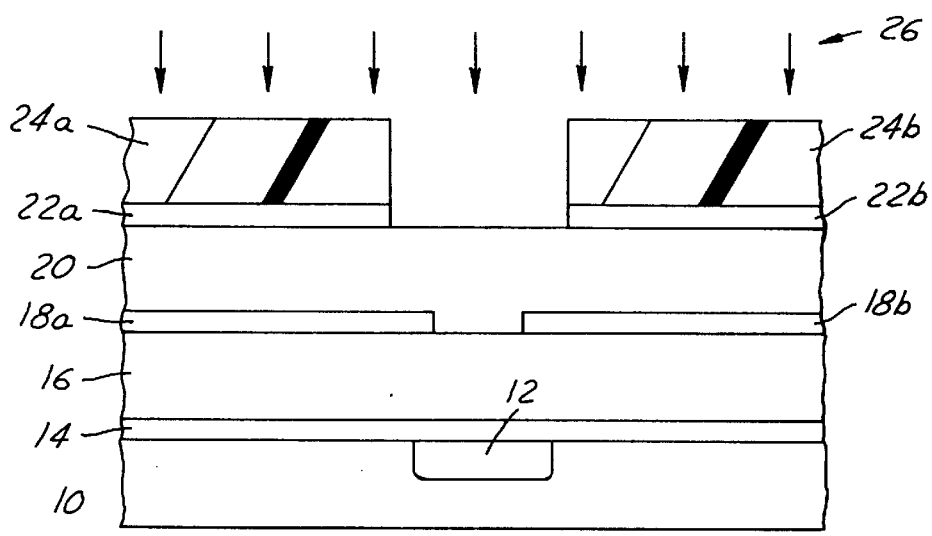

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein the blanket third etch stop/planarizing stop layer 22 has been patterned to form a pair of patterned third etch stop/planarizing stop layers 22a and 22b while employing the pair of patterned photoresist layers 24a and 24b as a first etch mask layer, in conjunction with a first etching plasma 26.

Within the preferred embodiment of the present invention when the blanket third etch stop/planarizing stop layer 22 is formed of a non-nitrogenated silicon carbide material, the first etching plasma 26 typically and preferably employs an etchant gas composition comprising $C_4F_8/C_2F_6/CF_4$, $N_2$, $O_2$, Co, Ar. Typically and preferably, the first etching plasma 26 also employs with respect to an eight inch or twelve inch diameter substrate: (1) a reactor chamber pressure of from about 0.5 to about 10 torr; (2) a source radio frequency power of from about 500 to about 10000 watts and a bias power of from about 50 to about 100 watts; (3) a substrate 10 temperature of from about −10 to about 50 degrees centigrade; (4) a $C_4F_8/C_2F_6/CF_4$ flow rate of from about 10 to about 500 standard cubic centimeters per minute (sccm);

and (5) an Ar, $N_2$, $O_2$, Co flow rate of from about 50 to about 500 standard cubic centimeters per minute (sccm).

Figure 3:
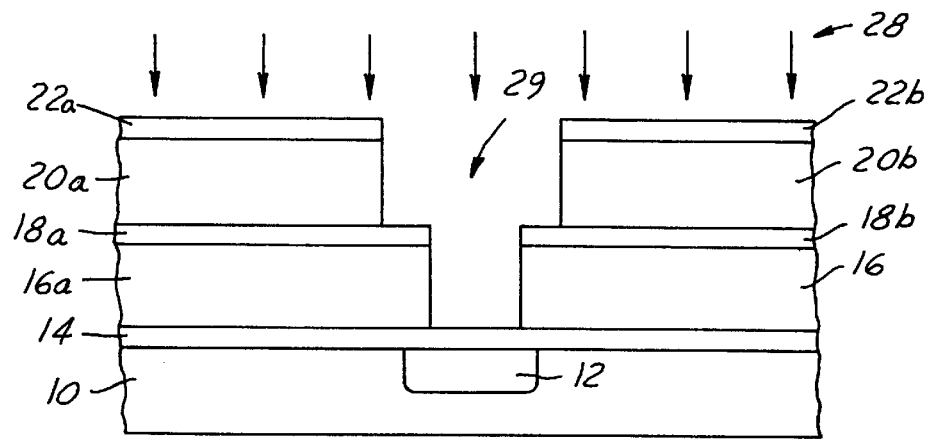

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein, in a first instance, the pair of patterned photoresist layers 24a and 24b has been stripped from the pair of patterned third etch stop/planarizing stop layers 22a and 22b.

Within the present invention and the preferred embodiment of the present invention, the pair of patterned photoresist layers 24a and 24b may be stripped from the pair of patterned third etch stop/planarizing stop layers 22a and 22b while employing methods as are conventional in the art of microelectronic fabrication, including but not limited to wet chemical stripping methods and dry plasma stripping methods. Alternatively, and as is understood by a person skilled in the art, and dependent upon the nature of the dielectric material(s) from which is (are) formed the blanket second dielectric layer 20 and the blanket first dielectric layer 16, the pair of patterned photoresist layers 24a and 24b may also be self stripping with respect to formation of the microelectronic fabrication whose schematic cross-sectional diagram is illustrated in FIG. 3 from the microelectronic fabrication whose schematic cross-sectional diagram is illustrated in FIG. 2.

Shown also within the schematic cross-sectional diagram of FIG. 3 is the results etching the blanket second dielectric layer 20 and the blanket first dielectric layer 16 to form a corresponding pair of patterned second dielectric layers 20a and 20b and a corresponding pair of patterned first dielectric layers 16a and 16b, while employing the pair of patterned third etch stop/planarizing stop layers 22a and 22b and the pair of patterned second etch stop layers 18a and 18b as second etch mask layers, in conjunction with a second etching plasma 28. As is also illustrated within the schematic cross-sectional diagram of FIG. 3, the blanket first etch stop/liner layer 14 remains unetched and serves as an additional etch stop layer, while having formed there above an aperture 29 whose dimensions are defined by the pair of patterned third etch stop/planarizing stop layers 22a and 22b and the pair of patterned second etch stop layers 18a and 18b.

Within the present invention and the preferred embodiment of the present invention, the second etching plasma 28 employs an etchant gas composition as is appropriate to the material or materials from which are formed the blanket second dielectric layer 20 and the blanket first dielectric layer 16.

Figure 4:
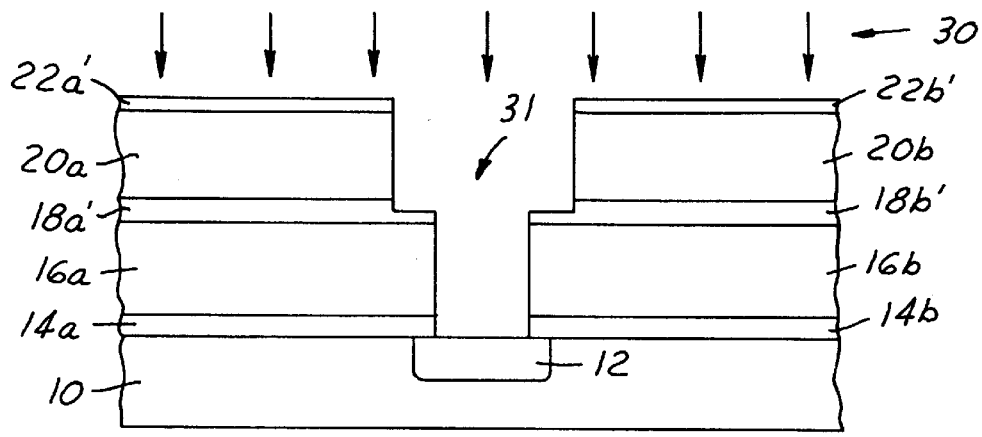

Referring now to FIG. 4, there is shown a schematic cross-sectional diagram illustrating the results of further processing of the microelectronic fabrication whose schematic cross-sectional diagram is illustrated in FIG. 3.

Shown in FIG. 4 is a schematic cross-sectional diagram of a microelectronic fabrication otherwise equivalent to the microelectronic fabrication whose schematic cross-sectional diagram is illustrated in FIG. 3, but wherein: (1) the pair of patterned third etch stop/planarizing stop layers 22a and 22b has been etched to form a pair of partially etched patterned third etch stop/planarizing stop layers 22a' and 22b' absent an etch mask layer formed thereover; (2) the pair of patterned second etch stop layers 18a and 18b has been partially etched to form a pair of partially etched patterned second etch stop layers 18a' and 18b' while simultaneously employing the pair of partially etched patterned third etch stop/planarizing stop layers 22a' and 22b' as a pair of third etch mask layers; and (3) the blanket first etch stop/liner layer 14 has been patterned to form a pair of patterned first etch stop/liner layers 14a and 14b while simultaneously employing the pair of partially etched patterned second etch stop layers 18a' and 18b' also as a pair of third etch mask layers, while employing a third etching plasma 30.

Within the present invention and the preferred embodiment of the present invention, and under circumstances where the pair of patterned third etch stop/planarizing stop layers 22a and 22b is formed of a silicon carbide material, the pair of patterned second etch stop layers 18a and 18b is formed of the silicon carbide material and the blanket first etch stop/liner layer 14 is formed of a nitrogenated silicon carbide material, each being formed employing a as disclosed in greater detail above, the third etching plasma 30 typically and preferably employs an etchant gas composition comprising $C_4F_8/C_2F_6/CF_4$ and Ar, $N_2$, $O_2$, Co, which has a specificity for a nitrogenated silicon carbide material in comparison with a silicon carbide material of at least about 20:1 and more preferably from about 20:1 to about 100:1.

Typically and preferably, the third etching plasma 30 will also employ with respect to an eight inch diameter substrate 10: (1) a reactor chamber pressure of from about 1.5 m to about 10 torr; (2) a radio frequency source power of from about 500 w to about 10 k watts and a bias power of from about 50 w to about 1000 watts; (3) a substrate 10 temperature of from about −10 to about 50 degrees centigrade; and (4) a $C_4F_8/C_2F_6/CF_4$ flow rate of from about 10 to about 500 standard cubic centimeters per minute (sccm); and (5) an argon flow rate of from about 500 to about 10000 standard cubic centimeters per minute (sccm).

As is illustrated within the schematic cross-sectional diagram of FIG. 4, and incident to etching completely through the blanket first etch stop/liner layer 14 to form the pair of patterned first etch stop/liner layers 14a and 14b while employing the third etching plasma 30: (1) the pair of patterned third etch stop/planarizing stop layers 22a and 22b as illustrated within the schematic cross-sectional diagram of FIG. 3 is etched to form the pair of partially etched patterned third etch stop/planarizing stop layers 22a' and 22b' of remaining thickness about 100 to about 1000 angstroms; and (2) the portions of the pair of patterned second etch stop layers 18a and 18b exposed to the third etching plasma 30 are also partially etched when forming the pair of partially etched patterned second etch stop layers 18a' and 18b', such exposed portions of the pair of partially etched patterned second etch stop layers 18a' and 18b' also having a remaining thickness of from about 100 to about 1000 angstroms.

As is yet further understood by a person skilled in the art, the pair of patterned first etch stop layers 14a and 14b, the pair of patterned first dielectric layers 16a and 16b, the pair of partially etched patterned second etch stop layers 18a' and 18b', the pair of patterned second dielectric layers 20a and 20b and the pair of partially etched patterned third etch stop/planarizing stop layers 22a' and 22b' in an aggregate form a dual damascene aperture 31, wherein: (1) the pair of patterned first etch stop/liner layers 14a and 14b, the pair of patterned first dielectric layers 16a and 16b and in part the pair of partially etched patterned second etch stop layers 18a' and 18b' define a via within the dual damascene aperture 31; and (2) in part the pair of partially etched patterned second etch stop layers 18a' and 18b', the pair of patterned second dielectric layers 20a and 20b and the pair of partially etched patterned third etch stop/planarizing stop layers 22a' and 22b' define a trench within the dual damascene aperture 31.

As is further understood by a person skilled in the art, by only partially etching the pair of patterned third etch stop/planarizing stop layers 22a and 22b when forming the pair of partially etched patterned third etch stop/planarizing stop layers 22a' and 22b' and only partially etching the exposed portions of the pair of patterned second etch stop layers 18a and 18b when forming the pair of partially etched patterned second etch stop layers 18a' and 18b', there is protected from damage when forming the dual damascene aperture 31 within the microelectronic fabrication whose schematic cross-sectional diagram is illustrated in FIG. 4 damage, and in particular third etching plasma 30 etch damage, to the pair of patterned second dielectric layers 20a and 20b and the pair of patterned first dielectric layers 16a and 16b. Such etching damage is otherwise likely to occur since the pair of patterned second dielectric layers 20a and 20b and the pair of patterned first dielectric layers 16a and 16b are formed of comparatively lower dielectric constant dielectric materials generally formed with lower densities which are susceptible to etch damage.

Figure 5:
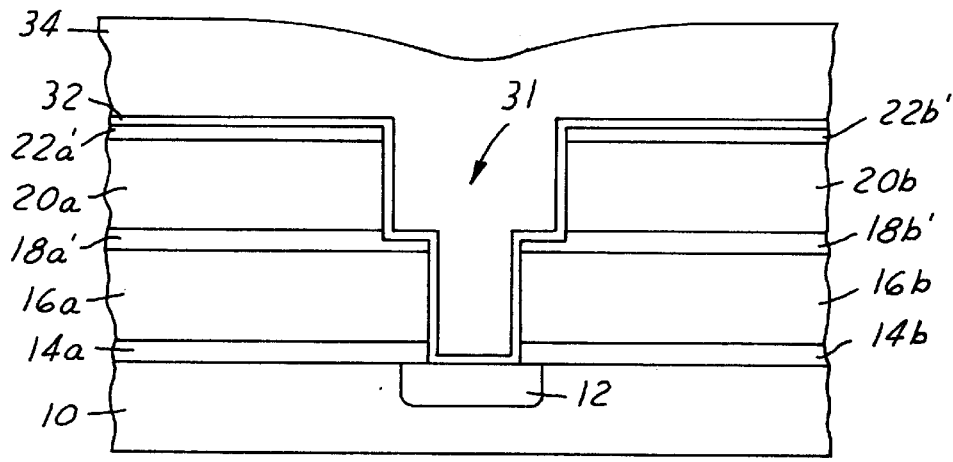

Referring now to FIG. 5, there is shown a schematic cross-sectional diagram illustrating the results of further processing of the microelectronic fabrication whose schematic cross-sectional diagram is illustrated in FIG. 4.

Shown in FIG. 5 is a schematic cross-sectional diagram of a microelectronic fabrication otherwise equivalent to the microelectronic fabrication whose schematic cross-sectional diagram is illustrated in FIG. 4, but wherein: (1) there is formed upon the pair of partially etched patterned third etch stop/planarizing stop layers 22a' and 22b' and conformally covering exposed surfaces of all layers and regions exposed within the dual damascene aperture 31 without filling the dual damascene aperture, a blanket barrier layer 32; and (2) there is formed upon the blanket barrier layer 32 a blanket conductor layer 34 which fills the dual damascene aperture 31.

Within the present invention and the preferred embodiment of the present invention, the blanket barrier layer 32 may be formed of barrier materials as are conventional in the art of microelectronic fabrication, including but not limited to refractory metal, refractory metal alloy and refractory metal alloy nitride barrier materials, the foregoing barrier materials generally but not exclusively being derived from refractory metals including but not limited to titanium, tantalum and tungsten. Typically and preferably, the blanket barrier layer 32 is formed to a thickness of from about 100 to about 1000 angstroms.

Within the present invention and the preferred embodiment of the present invention with respect to the blanket conductor layer, the blanket conductor layer may similarly also be formed of conductor materials as are conventional in the art of microelectronic fabrication, including but not limited to metal and metal alloy conductor materials, more particularly aluminum, aluminum alloy, copper and copper alloy conductor materials and most preferably copper and copper alloy conductor materials having a copper content of greater than about 95 weight percent. Typically and preferably, the blanket conductor layer 34 is formed upon the blanket barrier layer 32 to a thickness of from about 2000 to about 30000 angstroms while completely filling the dual damascene aperture 31.

Figure 6:
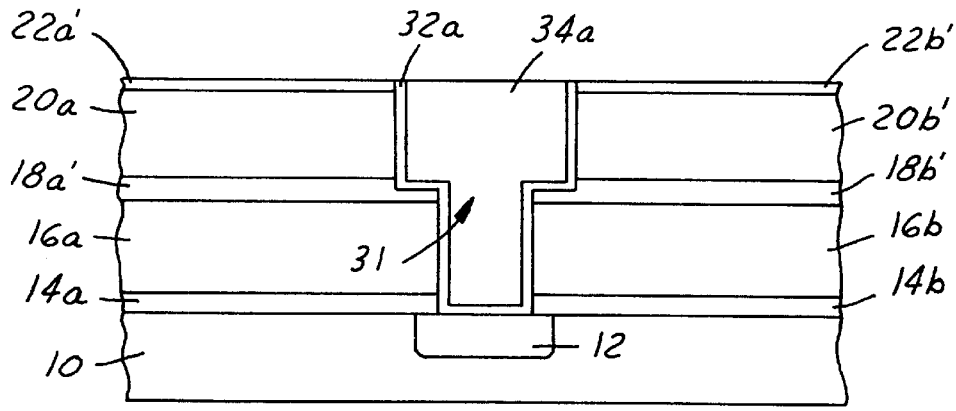

Referring now to FIG. 6, there is shown a schematic cross-sectional diagram illustrating the results of further processing of the microelectronic fabrication whose schematic cross-sectional diagram is illustrated in FIG. 5.

Shown in FIG. 6 is a schematic cross-sectional diagram of a microelectronic fabrication otherwise equivalent to the microelectronic fabrication whose schematic cross-sectional diagram is illustrated in FIG. 5, but wherein the blanket conductor layer 34 and the blanket barrier layer 32 have been planarized to form within the dual damascene aperture 31 a patterned barrier layer 32a having formed thereupon a contiguous patterned conductor interconnect and patterned conductor stud layer 34a.

Within the present invention and the preferred embodiment of the present invention, the blanket conductor layer 34 and the blanket barrier layer 32 may be planarized to form the corresponding patterned barrier layer 32a having formed thereupon the corresponding contiguous patterned conductor interconnect and patterned conductor stud layer 34a while employing planarizing methods, and in particular chemical mechanical polish (CMP) planarizing methods, as are conventional in the art of microelectronic fabrication.

Upon forming the microelectronic fabrication whose schematic cross-sectional diagram is illustrated in FIG. 6, there is formed a microelectronic fabrication in accord with the preferred embodiment of the present invention. The microelectronic fabrication has formed therein, while employing a dual damascene method, a patterned conductor having formed interposed between its patterns a dielectric layer formed of a comparatively low dielectric constant dielectric material, with attenuated damage to the dielectric layer. The present invention realizes the foregoing object by employing within the present invention a first etch stop/liner layer formed of a first material different from a second material employed for forming a second etch stop layer and preferably also a third etch stop layer, wherein one of the first material and the second material is a non-nitrogenated silicon carbide material and the other of the first material and the second material is a nitrogenated silicon carbide material. The selection of different materials for the first etch stop layer and the second etch stop layer provides that when completely etching through the first etch stop layer to reach a contact region formed there beneath there is not etched completely through the second etch stop layer to reach a first dielectric layer formed there beneath.

As is understood by a person skilled in the art, the preferred embodiment of the present invention is illustrative of the present invention rather than limiting of the present invention. Revisions and modifications may be made to methods, materials, structures and dimensions through which is provided a patterned conductor layer in accord with the preferred embodiment of the present invention, which still providing a dual damascene structure and a method for forming a dual damascene aperture in accord with the present invention, further in accord with the accompanying claims.

What is claimed is:

1. A method for forming a dual damascene aperture comprising:

providing a substrate having formed therein a contact region;

forming upon the substrate and the contact region a blanket first etch stop layer;

forming upon the blanket first etch stop layer a patterned first dielectric layer having formed aligned thereupon a patterned second etch stop layer in turn having formed thereupon a patterned second dielectric layer which leaves exposed a top surface portion of the patterned second etch stop layer, the foregoing series of patterned layers defining an aperture aligned above the contact region and having as bottom surfaces exposed top surface portions of the patterned second etch stop layer and the blanket first etch stop layer; and etching completely through the blanket first etch stop layer to reach the contact region while not etching completely through the patterned second etch stop layer to reach the patterned first dielectric layer to thus form from the aperture a dual damascene aperture, wherein one of the blanket first etch stop layer and the patterned second etch stop layer is formed of a non-nitrogenated silicon carbide material and the other of the blanket first etch stop layer and the patterned second etch stop layer is formed of a nitrogenated silicon carbide material.

2. The method of claim 1 further comprising forming into the dual damascene aperture a contiguous patterned conductor interconnect and patterned conductor stud layer.

3. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

4. The method of claim 1 wherein the substrate is a semiconductor substrate employed within a semiconductor integrated circuit microelectronic fabrication.

5. The method of claim 1 wherein each of the first dielectric layer and the second dielectric layer is formed of a comparatively low dielectric constant dielectric material selected from the group consisting of spin-on-glass (SOG) dielectric materials, spin-on- polymer (SOP) dielectric materials, nanoporous dielectric materials, amorphous carbon dielectric materials and fluorosilicate glass dielectric materials.

6. The method of claim 1 wherein each of the first dielectric layer and the second dielectric layer is formed to a thickness of from about 1.5 k to about 30 k angstroms.

7. The method of claim 1 wherein:

the blanket first etch stop layer is formed to a thickness of from about 100 to about 1000 angstroms; and the patterned second etch stop layer is formed to a thickness of from about 100 to about 1000 angstroms.

8. The method of claim 1 wherein the blanket first etch stop layer is formed of the nitrogenated silicon carbide material and the patterned second etch stop layer is formed of the non-nitrogenated silicon carbide material.

9. The method of claim 2 wherein the contiguous patterned conductor interconnect and patterned conductor stud layer is formed conductor material selected from the group consisting of copper and copper alloy conductor materials.

10. A microelectronic fabrication comprising:

a substrate having formed therein a contact region;

a patterned first etch stop layer formed upon the substrate, the patterned first etch stop layer having formed aligned thereupon a patterned first dielectric layer in turn having formed aligned at least in part thereupon a patterned second etch stop layer in turn having formed thereupon a patterned second dielectric layer which leaves exposed a top surface portion of the patterned second etch stop layer, the foregoing series of patterned layers defining a dual damascene aperture exposing the contact region, wherein one of the patterned first etch stop layer and the patterned second etch stop layer is formed of a non-nitrogenated silicon carbide material and the other of the patterned first etch stop layer and the patterned second etch stop layer is formed of a nitrogenated silicon carbide material.

11. The microelectronic fabrication of claim 10 further comprising a contiguous patterned conductor interconnect and patterned conductor stud layer formed into the dual damascene aperture.

12. The microelectronic fabrication of claim 10 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

13. The microelectronic fabrication of claim 10 wherein the substrate is a semiconductor substrate employed within a semiconductor integrated circuit microelectronic fabrication.

14. The microelectronic fabrication of claim 10 wherein each of the patterned first dielectric layer and the patterned second dielectric layer is formed of a comparatively low dielectric constant dielectric material selected from the group consisting of spin-on-glass (SOG) dielectric materials, spin-on-polymer (SOP) dielectric materials, nanoporous dielectric materials, amorphous carbon dielectric materials and fluorosilicate glass dielectric materials.

15. The microelectronic fabrication of claim 10 wherein each of the patterned first dielectric layer and the patterned second dielectric layer is formed to a thickness of from about 1.5 k to about 30 k angstroms.

16. The microelectronic fabrication of claim 10 wherein:

the patterned first etch stop layer is formed to a thickness of from about 100 to about 1000 angstroms; and the patterned second etch stop layer is formed to a thickness of from about 100 to about 1000 angstroms.

17. The microelectronic fabrication of claim 10 wherein the patterned first etch stop layer is formed of the nitrogenated silicon carbide material and the patterned second etch stop layer is formed of the non-nitrogenated silicon carbide material.

18. The microelectronic fabrication of claim 11 wherein the contiguous patterned conductor interconnect and patterned conductor stud layer is formed conductor material selected from the group consisting of copper and copper alloy conductor materials.

* * * * *